United States Patent
Kuwabara et al.

(10) Patent No.: US 12,167,555 B2
(45) Date of Patent: Dec. 10, 2024

(54) ELECTRONIC DEVICE AND WIRING METHOD OF ELECTRONIC DEVICE

(71) Applicant: DENSO TEN LIMITED, Hyogo (JP)

(72) Inventors: Jumpei Kuwabara, Hyogo (JP); Kota Minematsu, Hyogo (JP)

(73) Assignee: DENSO TEN LIMITED, Hyogo (JP)

( * ) Notice: Subject to any disclaimer, the term of this patent is extended or adjusted under 35 U.S.C. 154(b) by 251 days.

(21) Appl. No.: 17/992,323

(22) Filed: Nov. 22, 2022

(65) Prior Publication Data
US 2023/0171907 A1 Jun. 1, 2023

(30) Foreign Application Priority Data

Nov. 30, 2021 (JP) ................... 2021-193943
Oct. 14, 2022 (JP) ................... 2022-165194

(51) Int. Cl.
*H05K 5/02* (2006.01)
*B60K 35/00* (2024.01)
*B60K 35/60* (2024.01)

(52) U.S. Cl.
CPC .......... *H05K 5/0247* (2013.01); *B60K 35/00* (2013.01); *H05K 5/0226* (2013.01); *B60K 35/60* (2024.01); *B60K 2360/771* (2024.01)

(58) Field of Classification Search
CPC ...... H05K 5/0247; H05K 5/0226; H05K 7/02; H05K 5/02; B60K 35/00; B60K 35/60; B60K 2360/771; B60K 35/50
See application file for complete search history.

(56) References Cited

U.S. PATENT DOCUMENTS

| | | | | |
|---|---|---|---|---|
| 5,286,919 A | * | 2/1994 | Benson | H05K 5/0247 174/101 |
| 6,809,258 B1 | * | 10/2004 | Dang | G02B 6/4453 174/64 |
| 7,477,528 B2 | * | 1/2009 | Kim | H05K 5/02 361/752 |
| 7,945,136 B2 | * | 5/2011 | Cooke | G02B 6/44524 385/135 |
| 8,135,257 B2 | * | 3/2012 | Cooke | G02B 6/44524 385/135 |

(Continued)

FOREIGN PATENT DOCUMENTS

JP 2013-051661 A 3/2013
JP 2021-035103 A 3/2021

*Primary Examiner* — Anthony M Haughton
*Assistant Examiner* — Theron S Milliser
(74) *Attorney, Agent, or Firm* — Paratus Law Group, PLLC

(57) ABSTRACT

An electronic device includes: a panel; and a main body to which the panel is reversibly attached, the main body includes: first and second wiring extraction portions as defined herein; wiring connection terminals that are provided as defined herein; a first wiring area as defined herein; a second wiring area as defined herein; and a wire that extends from one of the first and second wiring extraction portions to one of the wiring connection terminals so as to be electrically connected to the panel, and the wire is arranged to extend from the first wiring extraction portion to the one of the wiring connection terminals via the first wiring area, or is arranged to extend from the second wiring extraction portion to the one of the wiring connection terminals via the first and second wiring areas.

12 Claims, 10 Drawing Sheets

(56) References Cited

U.S. PATENT DOCUMENTS

| | | | | |
|---|---|---|---|---|
| 8,437,597 | B2* | 5/2013 | Cooke | G02B 6/44715 |
| | | | | 385/135 |
| 10,111,352 | B2* | 10/2018 | Ahn | H05K 7/02 |
| 11,121,528 | B2* | 9/2021 | Claussen | H02B 1/32 |
| 11,502,488 | B2* | 11/2022 | Fariello | H04Q 1/06 |
| 2010/0054686 | A1* | 3/2010 | Cooke | G02B 6/44715 |
| | | | | 385/135 |
| 2010/0322578 | A1* | 12/2010 | Cooke | G02B 6/4471 |
| | | | | 385/135 |
| 2011/0211800 | A1* | 9/2011 | Cooke | G02B 6/44715 |
| | | | | 385/135 |
| 2019/0075375 | A1* | 3/2019 | Fariello | H04Q 1/06 |
| 2019/0363523 | A1* | 11/2019 | Claussen | H02G 3/088 |
| 2023/0171907 | A1* | 6/2023 | Kuwabara | H05K 5/0247 |
| | | | | 361/807 |

\* cited by examiner

ELECTRONIC DEVICE AND WIRING METHOD OF ELECTRONIC DEVICE

CROSS-REFERENCE TO RELATED APPLICATION

This application is based on and claims priority under 35 USC 119 from Japanese Patent Application No. 2021-193943 filed on Nov. 30, 2021 and Japanese Patent Application No. 2022-165194 filed on Oct. 14, 2022.

TECHNICAL FIELD

The present invention relates to an electronic device and a wiring method of the electronic device.

BACKGROUND ART

Conventionally, various techniques related to wiring have been proposed in electronic devices (see, for example, JP2021-035103A). In the conventional art, in a configuration in which end wires of a plurality of stator windings are tied (bound and bundled) to terminal pins via a plurality of guide pins, the number of the guide pins is set to be larger than the number of the terminal pins, and thus a wiring pattern of the end wires is freely formed.

SUMMARY OF INVENTION

For example, in an electronic device such as a display device that displays a video and the like, a panel having a display surface is attached to a main body, and the panel and the main body are connected to each other via a harness.

As a configuration of the panel, it is conceivable to provide a plurality of types of products, for example, a product attached to the main body in a state where the display surface faces the main body, and a product attached to the main body in a state where the display surface faces a side opposite to the main body, depending on, for example, specifications.

In the case of providing two types of products having different directions of panels as described above, there is a demand for sharing components as much as possible between the products. Also in some electronic devices other than the display device, an attachment direction of the panel with respect to the main body may change.

The present invention has been made in view of the above circumstances, and an object of the present invention is to provide an electronic device and a wiring method of the electronic device, in which a harness can be appropriately wired after components are shared when an attachment direction of a panel with respect to a main body changes.

In order to achieve the object, an aspect of the present invention provides an electronic device including a panel and a main body to which the panel is reversibly attached. The main body includes first and second wiring extraction portions, wiring connection terminals, a first wiring area, a second wiring area, and a wire. The first and second wiring extraction portions are provided opposite to each other on both right and left sides of the main body. The wiring connection terminals are provided at asymmetrical right and left positions of the main body under a virtual line connecting the first and second wiring extraction portions. The first wiring area is between the virtual line and the wiring connection terminals and is provided with a plurality of clamps. The second wiring area is between an upper end side of the main body above the virtual line and the first wiring area and is provided with a plurality of clamps. The wire extends from one of the first and second wiring extraction portions to one of the wiring connection terminals so as to be electrically connected to the panel. The wire is arranged to extend from the first wiring extraction portion to the one of the wiring connection terminals via the first wiring area, or is arranged to extend from the second wiring extraction portion to the one of the wiring connection terminals via the first and second wiring areas.

According to the aspect of the present invention, when an attachment direction of a panel with respect to a main body is changed, a harness is appropriately wired after components are shared.

DETAILED DESCRIPTION OF THE INVENTION

Hereinafter, embodiments of an electronic device and a wiring method of the electronic device disclosed in the present application will be described in detail with reference to the accompanying drawings. The present invention is not limited to embodiments described below.

Figure 1A:
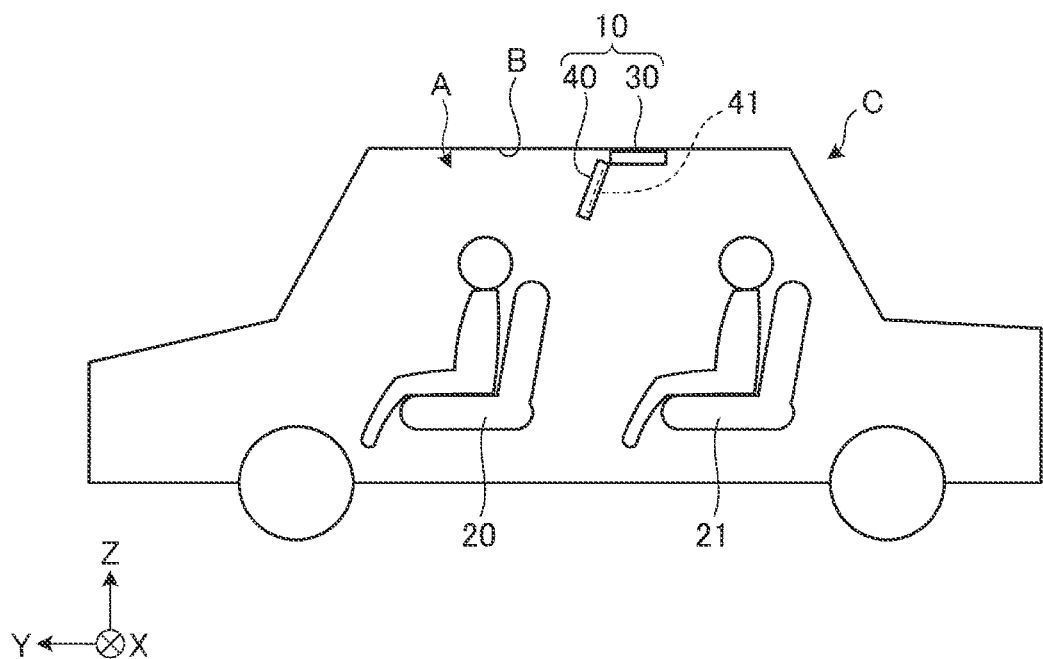
FIG. 1A is a diagram for explaining an electronic device according to an embodiment.
Figure 1B:
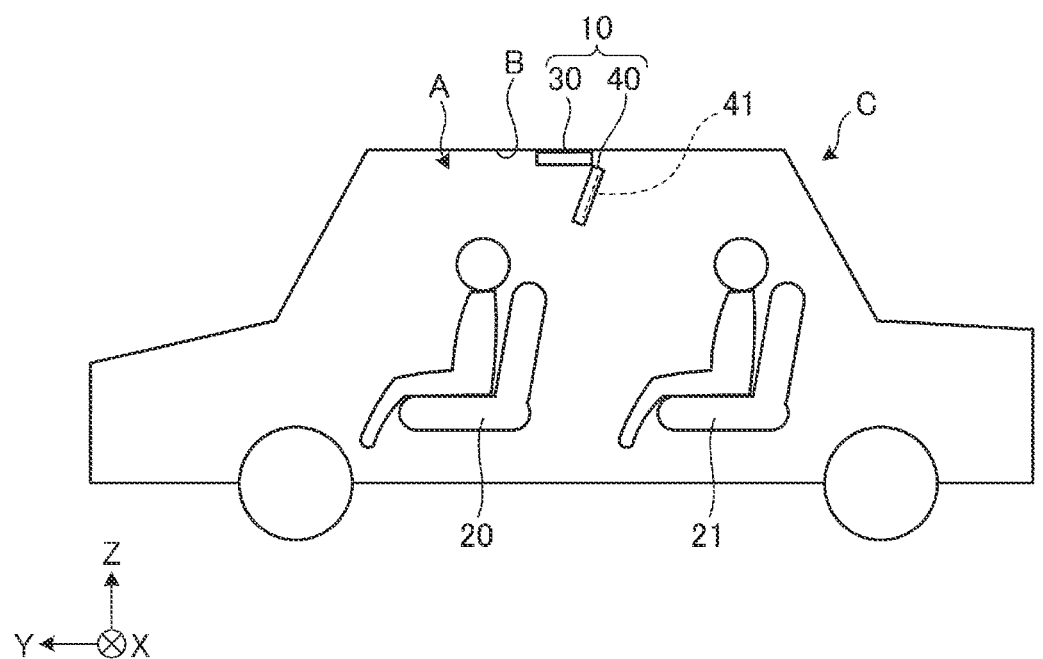
FIG. 1B is a diagram for explaining an electronic device according to an embodiment.
Figure 2A:
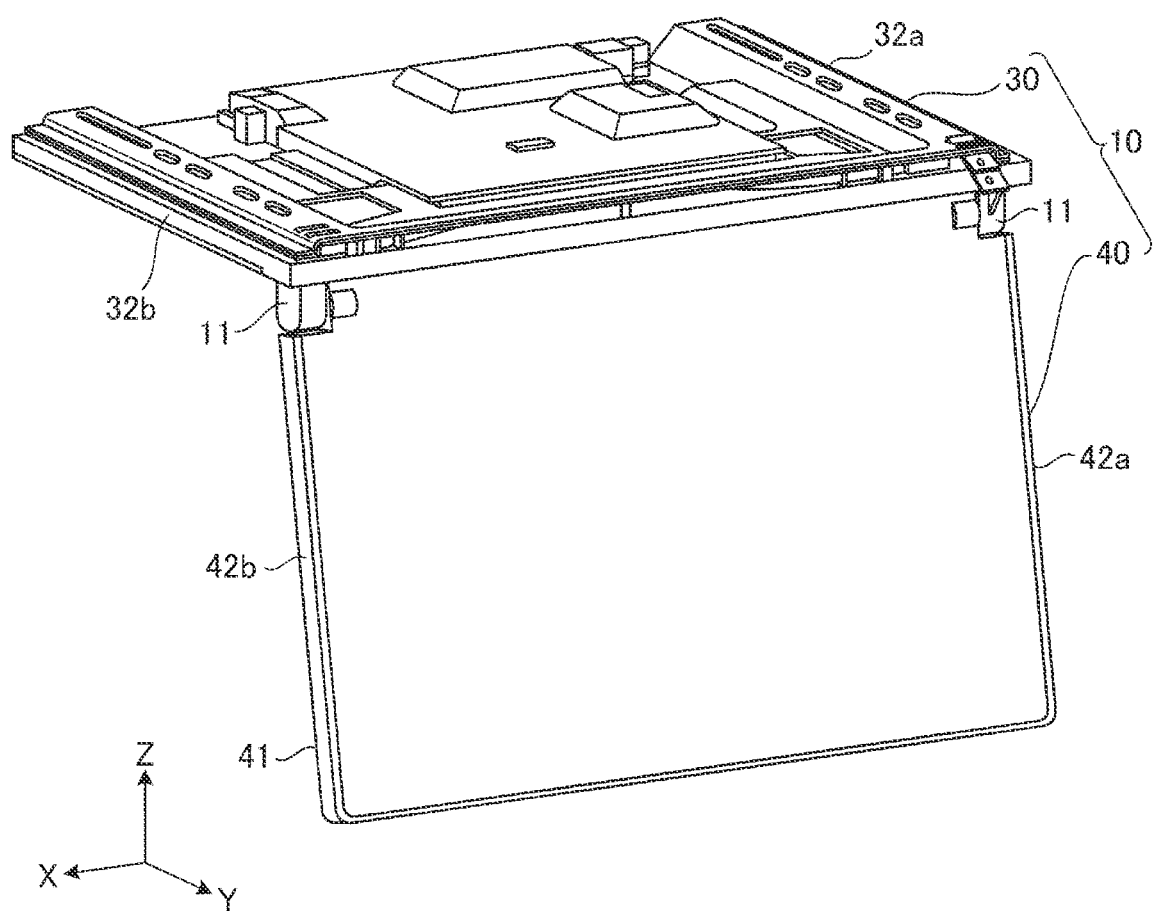
FIG. 2A is a perspective view of a display device shown in FIG. 1A.

FIGS. 1A and 1B are diagrams for explaining an electronic device according to an embodiment. FIGS. 1A and 1B and FIG. 2A and subsequent drawings to be described later are both schematic diagrams.

In FIGS. 1A and 1B, for convenience of description, a three-dimensional orthogonal coordinate system defined by an X-axis direction, a Y-axis direction, and a Z-axis direction orthogonal to each other is illustrated. Such an orthogonal coordinate system may also be shown in other drawings used in the following description. In the orthogonal coordinate system, an X axis is a left-right direction (width direction) of an electronic device or a vehicle, a Y axis is a front-rear direction of the electronic device or the vehicle, and a Z axis is a vertical direction. In the following description, expressions such as "X-axis direction", "Y-axis direction", and "Z-axis direction" are used, but these expressions mean the "X axis direction", "Y axis direction", and "Z axis direction" when the electronic device is attached to the vehicle in an illustrated state, and do not limit directions.

As shown in FIG. 1A, an electronic device 10 according to the present embodiment is mounted on a vehicle C, for example. As the electronic device 10, for example, a display device (monitor) that displays a video or the like can be used, but the electronic device 10 is not limited thereto. That is, for example, the electronic device 10 may be another type of electronic device such as a drive recorder or a speaker. Here, an example is shown in which the electronic device 10 is an in-vehicle device mounted on the vehicle C, but the present invention is not limited thereto, and the electronic device 10 may be a device installed indoors or outdoors or may be a device carried by a user. Hereinafter, the electronic device 10 may be referred to as a "display device 10".

The display device 10 is installed in a passenger compartment A of the vehicle C. For example, the display device 10 is installed on a ceiling surface B of the vehicle C. As an example, the display device 10 is installed behind a front seat 20 and in front of a rear seat 21. A place where the display device 10 is installed is merely an example and is not limited thereto. For example, the display device 10 may be installed in another place such as an instrument panel (not shown) in the passenger compartment A.

The display device 10 includes a main body 30 and a panel 40. The main body (base part) 30 is a housing that houses a circuit board or the like capable of executing, for example, a process of outputting a video signal, a process of supplying power to the panel 40, and the like. The main body 30 is attached to the ceiling surface B of the vehicle C.

The panel 40 includes a display surface (display) 41. The display surface 41 is an example of a main surface. Since the display surface 41 has a function of displaying a video, it can be said that the display surface (main surface) 41 is a functional surface having a function.

The panel 40 is attached to the main body 30 with the display surface 41 facing a user in the rear seat 21. Accordingly, the user in the rear seat 21 can visually recognize video or the like displayed on the display surface 41 of the panel 40.

The display device 10 is configured such that an attachment direction of the panel 40 with respect to the main body 30 can be changed. That is, the panel 40 can be reversibly attached to the main body 30. For example, in the panel 40, the attachment direction with respect to the main body 30 can be changed according to, for example, a specification of the vehicle C. That is, for example, as shown in FIG. 1A, the panel 40 may be attached to the main body 30 in a state where the display surface 41 faces the main body 30 (hereinafter, referred to as a "first state"), and as shown in FIG. 1B, the panel 40 may be attached to the main body 30 in a state where the display surface 41 faces a side opposite to the main body 30 (hereinafter, referred to as a "second state").

Specifically, for example, the direction of the main body 30 attached to the ceiling surface B may change according to, for example, a specification of the vehicle C. In a case where the display surface 41 of the panel 40 can be directed toward the rear seat 21 by changing an angle around a position (hinge (described later)) of the panel 40 attached to the main body 30, it is necessary to change the direction of the panel 40 attached to the main body 30 depending on whether an axial position (hinge) of the panel 40 attached to the main body 30 is forward (positive Y-axis direction; see FIG. 1A) or rearward (negative Y-axis direction; see FIG. 1B) in a traveling direction of the vehicle C.

Figure 2B:
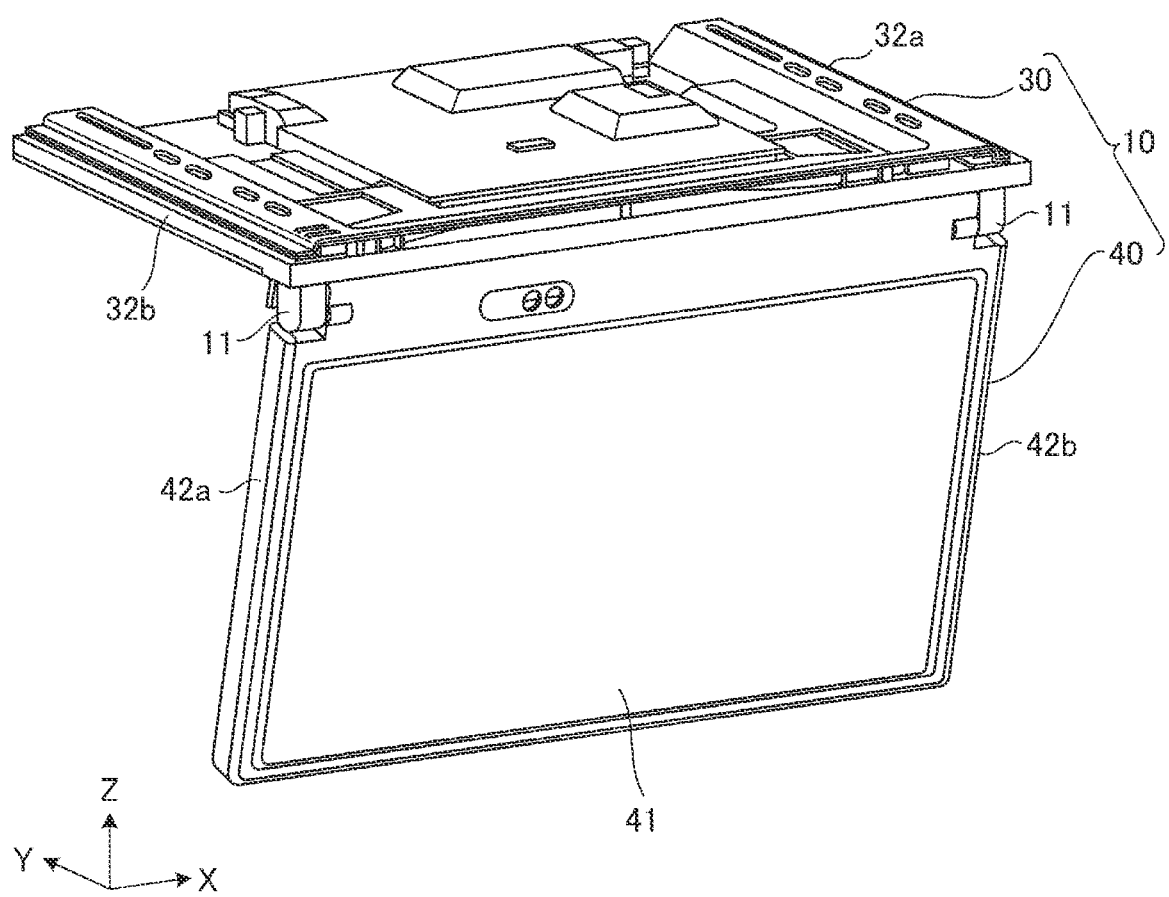
FIG. 2B is a perspective view of a display device shown in FIG. 1B.

Here, the display device 10 in which the attachment direction of the panel 40 can be changed will be described with reference to FIGS. 2A and 2B. FIG. 2A is a perspective view of the display device 10 shown in FIG. 1A, in other words, a perspective view of the display device 10 to which the panel 40 is attached in the first state where the display surface 41 faces the main body 30. FIG. 2B is a perspective view of the display device 10 shown in FIG. 1B, in other words, a perspective view of the display device 10 to which the panel 40 is attached in the second state where the display surface 41 faces the side opposite to the main body 30.

As shown in FIGS. 2A and 2B, the panel 40 is attached to the main body 30 via, for example, a hinge 11. Accordingly, the panel 40 is attached to the main body 30 so as to be rotatable about the hinge 11. That is, the hinge 11 is a member that rotatably connects the panel 40 to the main body 30. Therefore, the hinge 11 allows the panel 40 to be opened and closed with respect to the main body 30 attached to the ceiling surface B (see FIGS. 1A and 1B) of the vehicle C. In addition, for example, an angle of the display surface 41 of the display device 10 can be adjusted by rotating the panel 40 via the hinge 11.

As shown in FIG. 2A, in the display device 10 to which the panel 40 is attached in the first state, one end 32a of the main body 30 in a left-right direction (X-axis direction) is located at a position corresponding to one end 42a of the panel 40 in the left-right direction, in other words, the one end 32a and the one end 42a are located on the same side surface in the display device 10. The other end 32b of the main body 30 in the left-right direction is located at a position corresponding to the other end 42b of the panel 40 in the left-right direction, in other words, the other end 32b and the other end 42b are located on the same side surface in the display device 10.

On the other hand, as shown in FIG. 2B, in the display device 10 to which the panel 40 is attached in the second state, the panel 40 is inverted as compared with the panel 40 in the first state. Therefore, the one end 32a of the main body 30 is located at a position corresponding to the other end 42b of the panel 40, in other words, the one end 32a and the other end 42b are located on the same side surface in the display device 10. The other end 32b of the main body 30 is located at a position corresponding to the one end 42a of the panel 40, in other words, the other end 32b and the one end 42a are located on the same side surface in the display device 10.

Here, the main body 30 and the panel 40 are electrically connected to each other via a harness (cable, not shown in FIGS. 2A and 2B). For example, the harness extends from the panel 40 toward the main body 30 and is connected to a circuit board (not shown in FIGS. 2A and 2B) in the main body 30.

At this time, when an attachment direction of the panel 40 with respect to the main body 30 changes, a position of the harness extending from the panel 40 to the main body 30 changes, and a position at which the harness is wired in the main body 30 may also change. This will be described with reference to a comparative example of FIGS. 3A and 3B.

Figure 3A:
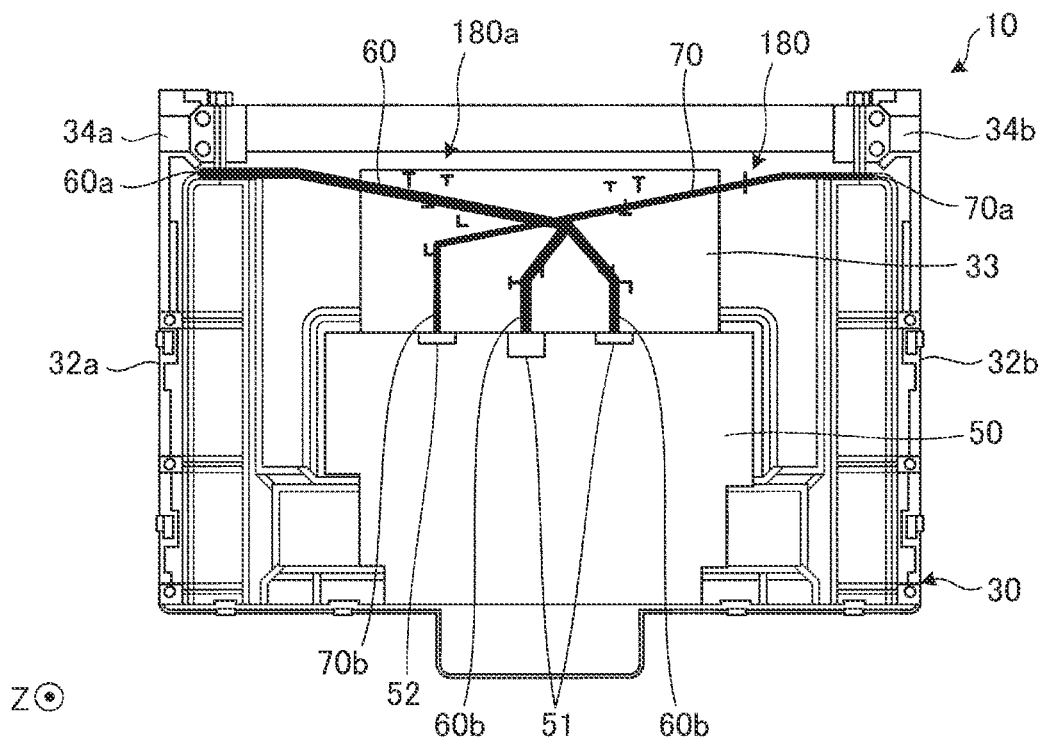
FIG. 3A shows an inside of a main body of a display device according to a comparative example.
Figure 3B:
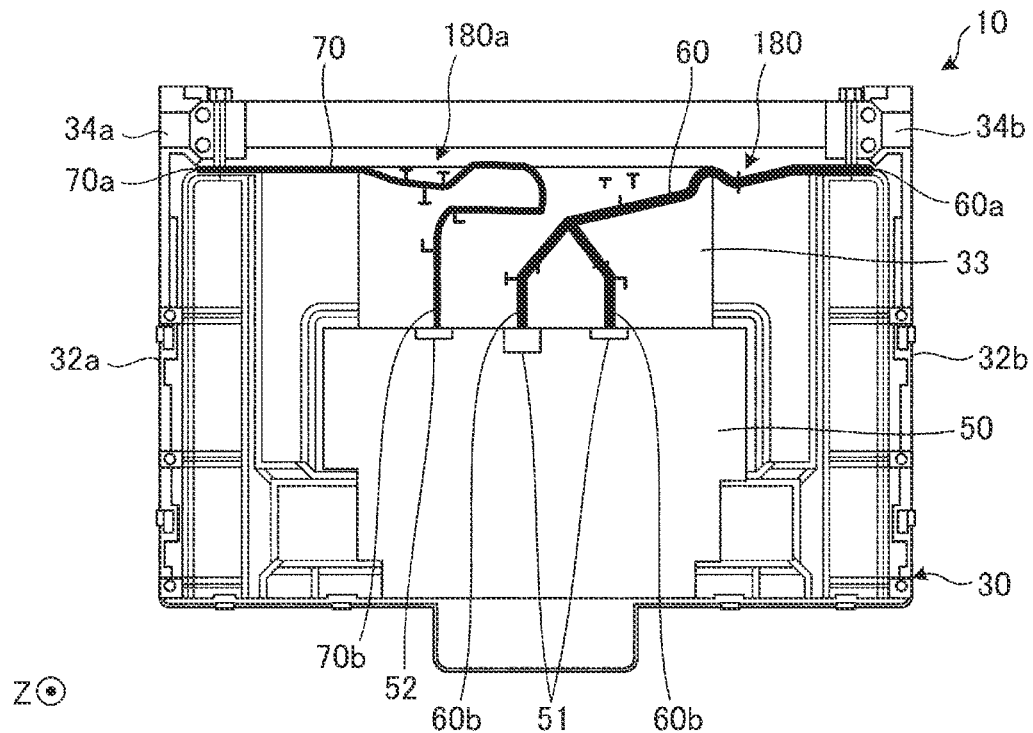
FIG. 3B shows an inside of a main body of a display device according to a comparative example.

FIGS. 3A and 3B show an inside of the main body 30 of the display device 10 according to a comparative example. FIG. 3A is a diagram corresponding to the main body 30 of FIG. 2A, in other words, a diagram showing the main body 30 to which the panel 40 in the first state is attached. FIG. 3B is a diagram corresponding to the main body 30 of FIG. 2B, in other words, a diagram showing the main body 30 to which the panel 40 in the second state is attached.

In the present specification, in the main body 30, a side connected to the panel 40 is referred to as an "upper side". In the main body 30, a side opposite to the side (upper side) connected to the panel 40 is referred to as a "lower side". A direction that is a width direction of the main body 30 and is orthogonal to an up-down direction of the main body 30 is referred to as the "left-right direction". In the examples of FIGS. 3A and 3B and FIGS. 4A and 4B to be described later, the one end 32a of the main body 30 is the "left side", and the other end 32b is the "right side".

As shown in FIGS. 3A and 3B, harnesses 60 and 70 extending from the panel 40 (see FIGS. 2A and 2B) are wired in the main body 30. For example, a wiring area 33 is formed on an inner bottom surface of the main body 30, and the harnesses 60 and 70 are wired in the wiring area 33. In other words, the harnesses 60 and 70 are arranged in a wiring path of the main body 30.

Here, the harness 60 and the harness 70 are different types of harnesses from each other. Hereinafter, the harness 60 may be referred to as a "first harness 60", and the harness 70 may be referred to as a "second harness 70". The first harness 60 and the second harness 70 are examples of a wire.

For example, the first harness 60 is a harness that supplies power to the panel 40. The power is, for example, power for the display surface (display) 41 of the panel 40 or power for a light receiving part of a remote controller, but these are examples and are not limited thereto.

For example, the second harness 70 is a harness that transmits a video signal to the panel 40. In the above description, the first harness 60 is for power supply and the second harness 70 is for a video signal, but these are merely examples and are not limited.

Since the first harness 60 and the second harness 70 are different in type (use), the first harness 60 and the second harness 70 are set to have different wire diameters, for example. Here, a case where a wire diameter of the first harness 60 is larger than a wire diameter of the second harness 70 will be described as an example, but the present invention is not limited thereto. That is, the wire diameter of the second harness 70 may be larger than the wire diameter of the first harness 60, or the wire diameters of the first and second harnesses 60 and 70 may be the same.

A circuit board 50 is housed in the main body 30. For example, connectors 51 and 52 are mounted on the circuit board 50. The connector 51 is connected to the first harness 60 (more precisely, a distal end portion 60b of the first harness 60). The connector 52 is connected to the second harness 70 (more precisely, a distal end portion 70b of the second harness 70). The connectors 51 and 52 are examples of wiring connection terminals.

The main body 30 includes a left wiring extraction portion 34a and a right wiring extraction portion 34b. The left and right wiring extraction portions 34a and 34b are provided opposite to each other on both right and left sides of the main body 30. Specifically, the left wiring extraction portion 34a is a portion where the first and second harnesses 60 and 70 extending from the panel 40 can be extracted on the one end 32a of the main body 30. The right wiring extraction portion 34b is a portion where the first and second harnesses 60 and 70 extending from the panel 40 can be extracted on the other end 32b of the main body 30.

The concept of being provided opposite to each other on both right and left sides of the main body 30 includes being provided opposite to each other on both right and left sides of an upper end side 32c of the main body 30. Specifically, the left wiring extraction portion 34a may be provided at a left end portion of the upper end side 32c of the main body 30, and the right wiring extraction portion 34b may be provided at a right end portion of the upper end side 32c of the main body 30.

Here, in the display device 10 in which the attachment direction of the panel 40 can be changed, the type of the harnesses extracted from the left and right wiring extraction portions 34a and 34b changes depending on the attachment direction of the panel 40.

That is, as shown in FIG. 3A, in a case of the display device 10 to which the panel 40 is attached in the first state, for example, the first harness 60 is extracted from the left wiring extraction portion 34a, and the second harness 70 is extracted from the right wiring extraction portion 34b. Therefore, an extraction portion 60a of the first harness 60 passing through the left wiring extraction portion 34a is located at the left wiring extraction portion 34a. An extraction portion 70a of the second harness 70 passing through the right wiring extraction portion 34b is located at the right wiring extraction portion 34b.

On the other hand, as shown in FIG. 3B, in a case of the display device 10 to which the panel 40 is attached in the second state, for example, the second harness 70 is extracted from the left wiring extraction portion 34a, and the first harness 60 is extracted from the right wiring extraction portion 34b. Therefore, the extraction portion 70a of the second harness 70 passing through the left wiring extraction portion 34a is located at the left wiring extraction portion 34a. The extraction portion 60a of the first harness 60 passing through the right wiring extraction portion 34b is located at the right wiring extraction portion 34b.

As described above, in a case where the panel 40 is attached in the first state and a case where the panel 40 is attached in the second state, when the first and second harnesses 60 and 70 are wired in the same area of the wiring area 33, the first and second harnesses 60 and 70 may not be appropriately wired.

In this regard, first, the first harness 60 will be described as an example. In the wiring area 33, the first harness 60 is wired from the left wiring extraction portion 34a to the connector 51 in the first state (see FIG. 3A), while the first harness 60 is wired from the right wiring extraction portion 34b to the connector 51 in the second state (see FIG. 3B).

Here, a distance from the left wiring extraction portion 34a to the connector 51 is different from a distance from the right wiring extraction portion 34b to the connector 51. Specifically, the distance from the left wiring extraction portion 34a to the connector 51 is longer than the distance from the right wiring extraction portion 34b to the connector 51. Therefore, for example, when the same first harness 60 is used in the first state and the second state, a length of the first harness 60 is set to a longer distance to the connector 51, that is, a length corresponding to the case of the first state. When the first harness 60 is used in the second state, an excessively excess length is generated in the first harness 60 of the wiring area 33, and thus, the first harness 60 may not be appropriately wired, for example, a slack is generated in the first harness 60.

The same applies to the second harness 70. That is, in the wiring area 33, the second harness 70 is wired from the right wiring extraction portion 34b to the connector 52 in the first state (see FIG. 3A), while the second harness 70 is wired from the left wiring extraction portion 34a to the connector 52 in the second state (see FIG. 3B).

Here, a distance from the right wiring extraction portion 34b to the connector 52 is different from a distance from the left wiring extraction portion 34a to the connector 52. Specifically, the distance from the right wiring extraction portion 34b to the connector 52 is longer than the distance from the left wiring extraction portion 34a to the connector 52. Therefore, for example, when the same second harness 70 is used in the first state and the second state, a length of the second harness 70 is set to a longer distance to the connector 52, that is, a length corresponding to the case of the first state. When the second harness 70 is used in the second state, an excessively excess length is generated in the second harness 70 of the wiring area 33, and thus, the second harness 70 may not be appropriately wired, for example, a slack is generated in the second harness 70.

Further, in the wiring area 33 according to the comparative example, a clamp portion 180 that sandwiches and holds the first harness 60 or the second harness 70 from both side surfaces may be formed. However, when the wire diameters of the first harness 60 and the second harness 70 are set to be different from each other, the clamp portion 180 may not appropriately hold the first and second harnesses 60 and 70. That is, when the first and second harnesses 60 and 70 are wired in the same area of the wiring area 33, the second harness 70 is held by the clamp portion 180 in the first state (see FIG. 3A), and the first harness 60 is held by the clamp portion 180 in the second state (see FIG. 3B).

Here, for example, when the wire diameter of the first harness 60 is larger than the wire diameter of the second harness 70, the clamp portion 180 is set to correspond to the wire diameter of the first harness 60. When the second harness 70 having a small wire diameter is sandwiched by the clamp portion 180 in the first state, an excessive gap is generated between the clamp portion 180 and the second harness 70, and the second harness 70 may not be appropriately held, in other words, the second harness 70 may not be appropriately wired.

In addition, as shown in FIG. 3B, for example, in a case where the second harness 70 is wired, when the same clamp portion as a clamp portion 180a (see FIG. 3A) that holds the first harness 60 in the first state is used, a bent portion at a steep angle is generated in the second harness 70. Therefore, the probability of occurrence of disconnection or the like of the second harness 70 increases.

Therefore, in the display device (electronic device) 10 according to the present embodiment, the first and second harnesses 60 and 70 can be appropriately wired after components are shared when the attachment direction of the panel 40 with respect to the main body 30 changes.

Figure 4A:
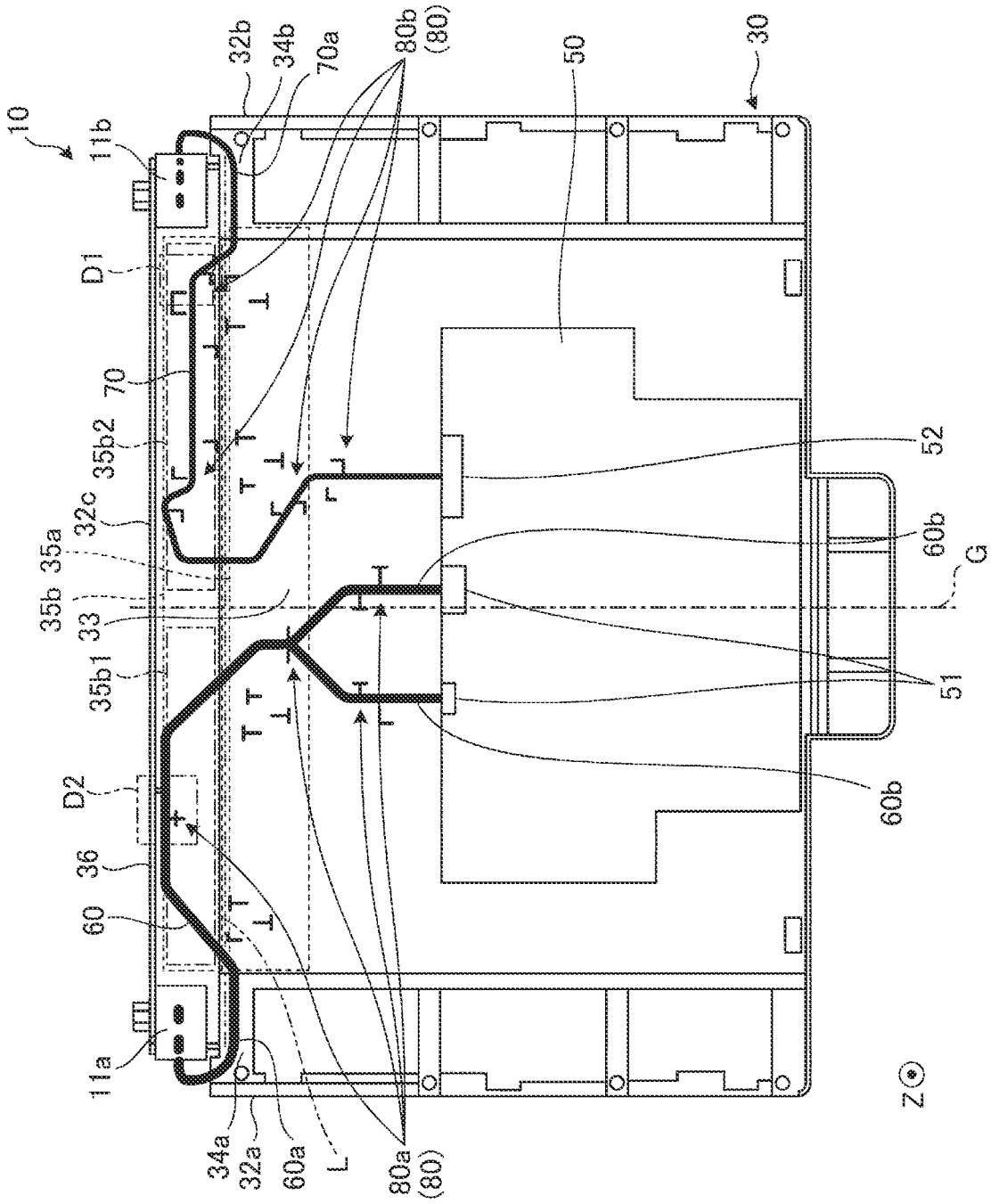
FIG. 4A shows an inside of a main body of a display device according to an embodiment.
Figure 4B:
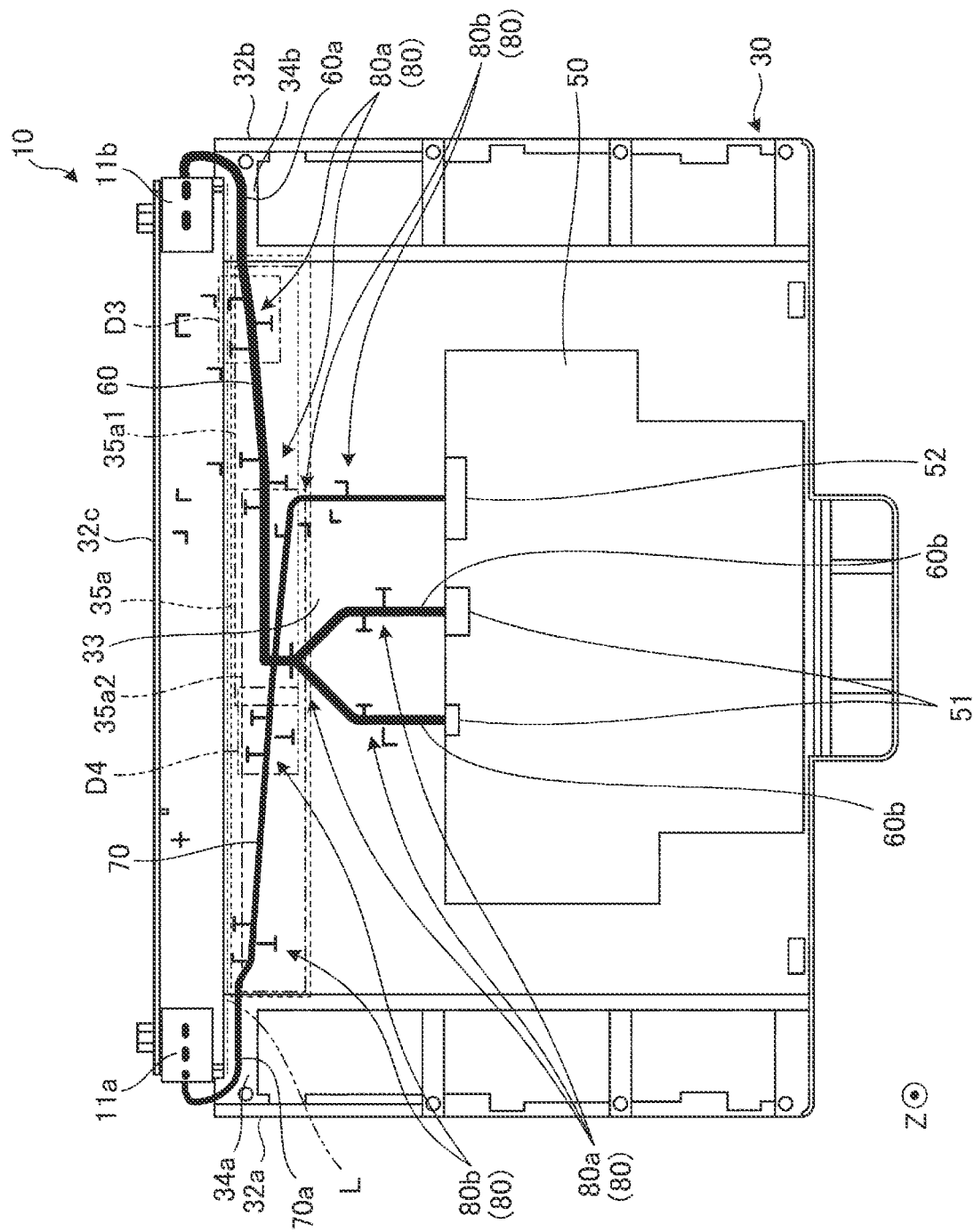
FIG. 4B shows an inside of a main body of a display device according to an embodiment.

Hereinafter, a configuration of the display device (electronic device) 10 according to the present embodiment will be specifically described with reference to FIG. 4A and subsequent drawings. FIGS. 4A and 4B show an inside of the main body 30 of the display device 10 according to the present embodiment. FIG. 4A is a diagram corresponding to the main body 30 of FIG. 2A, in other words, a diagram showing the main body 30 to which the panel 40 in the first state is attached. FIG. 4B is a diagram corresponding to the main body 30 of FIG. 2B, in other words, a diagram showing the main body 30 to which the panel 40 in the second state is attached. In the description of FIG. 4A and the subsequent drawings, the description of the components that have already been described may be simplified or omitted.

The main body 30 includes first and second hinges 11a and 11b. The main body 30 is connected to the panel 40 (see FIGS. 2A and 2B) via the first and second hinges 11a and 11b. The first and second hinges 11a and 11b are provided opposite to each other on both right and left sides of the main body 30, and attach the panel 40 to the main body 30. Specifically, the first hinge 11a is provided on the one end 32a on the left side of the main body 30 and on the upper end side (upper edge; end portion) 32c of the main body 30. The second hinge 11b is provided on the other end 32b on the right side of the main body 30 and on the upper end side 32c side of the main body 30.

The main body 30 includes connectors 51 and 52. The connectors 51 and 52 are provided in the main body 30. The connectors 51 and 52 are provided at asymmetrical right and left positions of the main body 30. For example, there are a plurality of (two) connectors 51. The two connectors 51 are provided near a center line G (see FIG. 4A) in the left-right direction of the main body 30 and at a position on the left side of the center line G. There is one connector 52. The connector 52 is provided at a position on the right side of the center line G.

Here, a positional relationship between the connectors 51 and 52 and the left and right wiring extraction portions 34a and 34b will be described. As described above, the connectors 51 and 52 are provided at the asymmetrical right and left positions of the main body 30. Therefore, a positional relationship between the connector 51 and the left and right wiring extraction portions 34a and 34b is such that the distance (wiring distance) from the left wiring extraction portion 34a to the connector 51 is different from the distance (wiring distance) from the right wiring extraction portion 34b to the connector 51. Specifically, the distance from the right wiring extraction portion 34b to the connector 51 (see FIG. 4B) is longer than the distance from the left wiring extraction portion 34a to the connector 51 (see FIG. 4A). Similarly, a positional relationship between the connector 52 and the left and right wiring extraction portions 34a and 34b is such that the distance (wiring distance) from the left wiring extraction portion 34a to the connector 52 is different from the distance (wiring distance) from the right wiring extraction portion 34b to the connector 52. Specifically, the distance from the left wiring extraction portion 34a to the connector 52 (see FIG. 4B) is longer than the distance from the right wiring extraction portion 34b to the connector 52 (see FIG. 4A).

In the display device 10 according to the present embodiment, a first wiring area 35a (see FIGS. 4A and 4B) and a second wiring area 35b (see FIG. 4A) are set in the wiring area 33 in which the first and second harnesses 60 and 70 of the main body 30 are wired. In FIGS. 4A and 4B, for convenience of understanding, the first and second wiring areas 35a and 35b are surrounded by broken lines.

As shown in FIGS. 4A and 4B, in the main body 30, a line L connecting the left wiring extraction portion 34a and the right wiring extraction portion 34b is set. The connectors 51 and 52 are provided under the line L. The line L is a virtual line, and is not actually drawn on the main body 30.

The first wiring area 35a is between the line L and the connectors 51 and 52. The second wiring area 35b is between the upper end side 32c of the main body 30 above the line L and the first wiring area 35a. A plurality of clamp portions 80 are provided in each of the first and second wiring areas 35a and 35b.

Specifically, as shown in FIGS. 4A and 4B, the first wiring area 35a is a wiring area in which the first and second harnesses 60 and 70 are held by the clamp portion 80 and wired regardless of whether the panel 40 is attached to the main body 30 in the first state or the second state. As shown in FIG. 4A, the second wiring area 35b is a wiring area in which the first and second harnesses 60 and 70 are held by the clamp portion 80 and wired when the panel 40 is attached to the main body 30 in the first state. The clamp portions 80 define positions of the first and second harnesses 60 and 70, and are an example of the plurality of clamps.

Specifically, the first wiring area 35a and the second wiring area 35b are set to regions different from each other in the wiring area 33. For example, the first wiring area 35a is set on a center of the main body 30 with respect to the second wiring area 35b, in other words, on the circuit board 50 (connectors 51 and 52) disposed in a vicinity of the center of the main body 30. On the other hand, the second wiring area 35b is provided on the upper end side (upper edge; end portion) 32c of the main body 30.

In the above description, two wiring areas, that is, the first and second wiring areas 35a and 35b are set in the wiring area 33, but the present invention is not limited thereto, and for example, three or more wiring area 33 may be set. That is, a plurality of wiring areas are set in the wiring area 33.

In this way, in the present embodiment, a plurality of wiring areas including the first and second wiring areas 35a and 35b in which the first and second harnesses 60 and 70 are held by the clamp portion 80 and wired in the first state and the first wiring area 35a in which the first and second harnesses 60 and 70 are held by the clamp portion 80 and wired in the second state are set in the wiring area 33.

Accordingly, since the first and second harnesses 60 and 70 are wired in different wiring areas (here, the first and second wiring areas 35a and 35b) depending on whether the panel 40 is attached in the first state or the second state, the first and second harnesses 60 and 70 can be appropriately wired.

In this regard, first, the first harness 60 will be described as an example. As shown in FIG. 4A, the first harness 60 in the first state extends from the panel 40 (see FIG. 2A) and passes through the inside of the first hinge 11a. The first harness 60 passes through the inside of the first hinge 11a, and then extends to the left wiring extraction portion 34a while being curved. The first harness 60 extending from the left wiring extraction portion 34a is electrically connected to the connector 51 via the first and second wiring areas 35a and 35b. Precisely, the first harness 60 is connected to the connector 51 via the first wiring area 35a after passing through the second wiring area 35b.

As shown in FIG. 4B, the first harness 60 in the second state extends from the panel 40 and passes through the inside of the second hinge 11b. After passing through the inside of the second hinge 11b, the first harness 60 extends to the right wiring extraction portion 34b while being curved. The first harness 60 extending from the right wiring extraction portion 34b is electrically connected to the connector 51 via the first wiring area 35a. That is, the first harness 60 is connected to the connector 51 via only the first wiring area 35a without passing through the second wiring area 35b.

As shown in FIGS. 4A and 4B, the distance from the left wiring extraction portion 34a to the connector 51 is different from the distance from the right wiring extraction portion 34b to the connector 51. Specifically, in the example shown in FIGS. 4A and 4B, the distance from the right wiring extraction portion 34b to the connector 51 is longer than the distance from the left wiring extraction portion 34a to the connector 51. Therefore, for example, when the same first harness 60 is used in the first state and the second state (when the first harness 60 is shared), the length of the first harness 60 is set to a longer distance to the connector 51, that is, a length corresponding to the case of the second state. When the first harness 60 is used in the first state, an excessively excess length may be generated in the first harness 60 of the wiring area 33. However, as shown in FIG. 4A, the first harness 60 according to the present embodiment can be detoured and wired so as to absorb the excess length in the second wiring area 35b.

Therefore, even when the attachment direction of the panel 40 with respect to the main body 30 changes between the first and second states, a slack or a bent portion at a steep angle is less likely to occur in the first harness 60, and as a result, the first harness 60 can be appropriately wired.

As described above, the first harness 60 extends from one of the left wiring extraction portion 34a (an example of the second wiring extraction portion) and the right wiring extraction portion 34b (an example of the first wiring extraction portion) to the connector 51 in accordance with the attachment direction of the panel 40. The first harness 60 is arranged to extend from the right wiring extraction portion 34b (an example of the first wiring extraction portion) to the connector 51 via the first wiring area 35a (see FIG. 4B), or is arranged to extend from the left wiring extraction portion 34a (an example of the second wiring extraction portion) to the connector 51 via the first wiring area 35a and the second wiring area 35b (see FIG. 4A).

In this way, when the attachment direction of the panel 40 with respect to the main body 30 is changed by arranging the first harness 60, the first harness 60 can be appropriately wired after a component (here, the first harness 60) is shared.

Next, the second harness 70 will be described as an example. As shown in FIG. 4A, the second harness 70 in the first state extends from the panel 40 and passes through the inside of the second hinge 11b. After passing through the inside of the second hinge 11b, the second harness 70 extends to the right wiring extraction portion 34b while being curved. The second harness 70 extending from the right wiring extraction portion 34b is electrically connected to the connector 52 via the first and second wiring areas 35a and 35b. Precisely, the second harness 70 is connected to the connector 52 via the first wiring area 35a after passing through the second wiring area 35b.

As shown in FIG. 4B, the second harness 70 in the second state extends from the panel 40 and passes through the inside of the first hinge 11a. The second harness 70 passes through the inside of the first hinge 11a, and then extends to the left wiring extraction portion 34a while being curved. The second harness 70 extending from the left wiring extraction portion 34a is electrically connected to the connector 52 via the first wiring area 35a. That is, the second harness 70 is connected to the connector 52 via only the first wiring area 35a without passing through the second wiring area 35b.

As shown in FIGS. 4A and 4B, the distance from the right wiring extraction portion 34b to the connector 52 is different from the distance from the left wiring extraction portion 34a to the connector 52. Specifically, in the example of FIGS. 4A and 4B, the distance from the left wiring extraction portion 34a to the connector 52 is longer than the distance from the right wiring extraction portion 34b to the connector 52. Therefore, for example, when the same second harness 70 is used in the first state and the second state (when the second harness 70 is shared), the length of the second harness 70 is set to a longer distance to the connector 52, that is, a length corresponding to the case of the second state. When the second harness 70 is used in the first state, an excessively excess length may be generated in the second harness 70 of the wiring area 33. However, as shown in FIG. 4A, the second harness 70 according to the present embodiment can be detoured and wired so as to absorb the excess length in the second wiring area 35b.

Therefore, even when the attachment direction of the panel 40 with respect to the main body 30 changes between the first and second states, a slack or a bent portion at a steep angle is less likely to occur in the second harness 70, and as a result, the second harness 70 can be appropriately wired.

As described above, the second harness 70 extends from one of the left wiring extraction portion 34a (an example of the first wiring extraction portion) and the right wiring extraction portion 34b (an example of the second wiring extraction portion) to the connector 52 in accordance with the attachment direction of the panel 40. The second harness 70 is arranged to extend from the left wiring extraction portion 34a (an example of the first wiring extraction portion) to the connector 52 via the first wiring area 35a (see FIG. 4B), or is arranged to extend from the right wiring extraction portion 34b (an example of the second wiring extraction portion) to the connector 52 via the first wiring area 35a and the second wiring area 35b (see FIG. 4A).

In this way, when the attachment direction of the panel 40 with respect to the main body 30 is changed by arranging the second harness 70, the second harness 70 can be appropriately wired after a component (here, the second harness 70) is shared.

One (for example, the first harness 60) of the first harness 60 and the second harness 70 is an example of the first wire, and the other (for example, the second harness 70) of the first harness 60 and the second harness 70 is an example of a second wire.

As shown in FIG. 4B, the first wiring area 35a is set to include a wiring area 35a1 in which the first harness 60 is held by a clamp portion 80a and wired and a wiring area 35a2 in which the second harness 70 is held by a clamp portion 80b and wired. For example, the wiring area 35a1 is set on the right wiring extraction portion 34b in the first wiring area 35a, and the wiring area 35a2 is set on the left wiring extraction portion 34a in the first wiring area 35a.

As shown in FIG. 4A, the second wiring area 35b is set to include a wiring area 35b1 in which the first harness 60 is held by the clamp portion 80a and wired and a wiring area 35b2 in which the second harness 70 is held by the clamp portion 80b and wired. For example, the wiring area 35b1 is set on the left wiring extraction portion 34a in the second wiring area 35b, and the wiring area 35b2 is set on the right wiring extraction portion 34b in the second wiring area 35b. The clamp portion 80a is a clamp portion capable of holding the first harness 60, the clamp portion 80b is a clamp portion capable of holding the second harness 70, and these configurations will be described later.

In this way, in the present embodiment, the first wiring area 35a and the second wiring area 35b include the wiring areas 35a1 and 35b1 in which the first harness 60 is held by the clamp portion 80a and wired and the wiring areas 35a2 and 35b2 in which the second harness 70 is held by the clamp portion 80b and wired, respectively.

Accordingly, in the present embodiment, the first and second harnesses 60 and 70 can be wired more appropriately. That is, the first and second wiring areas 35a and 35b are divided into the wiring areas 35a1 and 35b1 in which the first harness 60 is wired and the wiring areas 35a2 and 35b2 in which the second harness 70 is wired, respectively. Therefore, the wired first harness 60 and the wired second harness 70 can be made less likely to interfere with each other, and thus the first and second harnesses 60 and 70 can be wired more appropriately.

Here, wiring distances of the first and second harnesses 60 and 70 will be described. In the present embodiment, for example, the wiring distances of the first and second harnesses 60 and 70 in the second wiring area 35b are set to be the same as the wiring distances of the first and second harnesses 60 and 70 in the first wiring area 35a. Accordingly, in the present embodiment, the first and second harnesses 60 and 70 can be shared.

First, the first harness 60 will be specifically described as an example. For example, the wiring distance of the first harness 60 in the first state, specifically, the wiring distance from the left wiring extraction portion 34a to the connector 51 through the second wiring area 35b (more specifically, wiring area 35b1) and the first wiring area 35a of the wiring area 33 is set to be same as the wiring distance of the first harness 60 in the second state, specifically, the wiring distance from the right wiring extraction portion 34b to the connector 51 through the first wiring area 35a (more specifically, wiring area 35a1) of the wiring area 33.

Accordingly, for example, even when the attachment direction of the panel 40 with respect to the main body 30 changes between the first state and the second state, the first harness 60 can be shared between the first state and the second state, that is, the first harnesses 60 having the same length can be used.

Next, the second harness 70 will be described. For example, the wiring distance of the second harness 70 in the first state, specifically, the wiring distance from the right wiring extraction portion 34b to the connector 52 through the second wiring area 35b (more specifically, wiring area 35b2) and the first wiring area 35a of the wiring area 33 is set to be same as the wiring distance of the second harness 70 in the second state, specifically, the wiring distance from the left wiring extraction portion 34a to the connector 52 through the first wiring area 35a (more specifically, wiring area 35a2) of the wiring area 33.

Accordingly, for example, even when the attachment direction of the panel 40 with respect to the main body 30 changes between the first state and the second state, the second harness 70 can be shared between the first state and the second state, that is, the second harnesses 70 having the same length can be used.

The first harness 60 and the second harness 70 may be arranged to intersect with each other in the wiring area 33 of the main body 30 or may be arranged not to intersect with each other in accordance with the attachment direction of the panel 40. Specifically, as shown in FIG. 4A, the first and second harnesses 60 and 70 in the first state are arranged not to intersect with each other in the wiring area 33 of the main body 30. That is, the connector 51 corresponding to the first harness 60 extending from the left wiring extraction portion 34a is provided closer than the connector 52 corresponding to the second harness 70. The connector 52 corresponding to the second harness 70 extending from the right wiring extraction portion 34b is provided closer than the connector 51 corresponding to the first harness 60. Therefore, the first and second harnesses 60 and 70 in the first state are arranged not to intersect with each other in the wiring area 33 of the main body 30.

On the other hand, as shown in FIG. 4B, the first and second harnesses 60 and 70 in the second state are arranged to intersect with each other in the wiring area 33 of the main body 30. Specifically, the first and second harnesses 60 and 70 in the second state are arranged to intersect each other in the first wiring area 35a of the main body 30. That is, the connector 51 corresponding to the first harness 60 extending from the right wiring extraction portion 34b is provided farther than the connector 52 corresponding to the second harness 70. The connector 52 corresponding to the second harness 70 extending from the left wiring extraction portion 34a is provided farther than the connector 51 corresponding to the first harness 60. Therefore, the first and second harnesses 60 and 70 in the second state are arranged to intersect with each other in the wiring area 33 of the main body 30.

In this way, the first harness 60 and the second harness 70 according to the present embodiment are arranged to intersect with each other or are arranged not to intersect with each other. Accordingly, the first and second harnesses 60 and 70 can be wired regardless of positions of the connectors 51 and 52.

Next, the clamp portion 80 will be described. As shown in FIG. 4A, in the display device 10 according to the present embodiment, the clamp portion 80a capable of holding the first harness 60 and the clamp portion 80b capable of holding the second harness 70 are formed in the wiring area 33 including the second wiring area 35b. In the example of FIG. 4A, a plurality of clamp portions 80a and 80b are formed, but the number and positions of the clamp portions 80a and 80b are merely examples and are not limited thereto.

Figure 5:
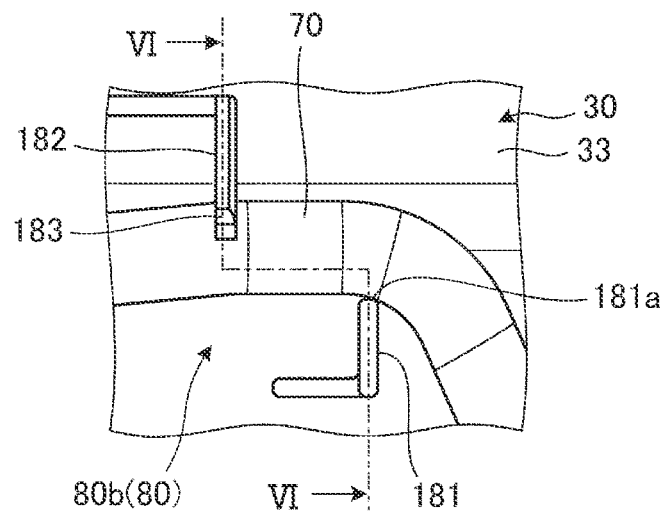
FIG. 5 is an enlarged view of a clamp portion in a second wiring area.
Figure 6:
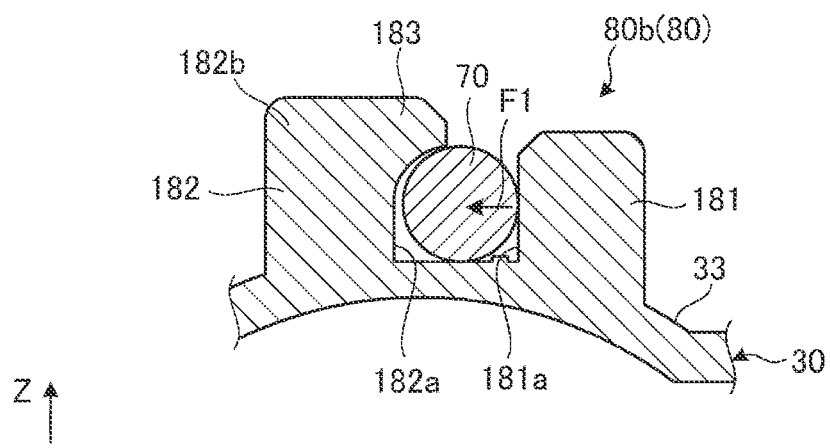
FIG. 6 is a cross-sectional view taken along a line VI-VI of FIG. 5.

First, among the plurality of clamp portions 80b, the clamp portion 80b formed in the second wiring area 35b (specifically, wiring area 35b2) will be described with reference to FIGS. 5 and 6. FIG. 5 is an enlarged view of the clamp portion 80b of the second wiring area 35b, and specifically, is an enlarged view of a portion D1 surrounded by a two-dot chain line in FIG. 4A. FIG. 6 is a cross-sectional view taken along a line VI-VI of FIG. 5.

As shown in FIGS. 5 and 6, the clamp portion 80b includes a plurality of (for example, two) ribs 181 and 182. The ribs 181 and 182 are formed on the wiring area 33 of the main body 30, and more specifically, are formed so as to protrude upward (positive Z-axis direction) from the wiring area 33.

The ribs 181 and 182 are formed to be separated from each other. For example, the ribs 181 and 182 are formed to be separated from each other along a wiring direction of the second harness 70. The ribs 181 and 182 are formed so as to be alternated with each other with the second harness 70 interposed therebetween, in other words, are formed so as to be inclined with respect to each other with the second harness 70 interposed therebetween.

The second harness 70 is wired between the rib 181 and the rib 182 configured as described above. That is, the second harness 70 is wired and held so as to be sandwiched between the rib 181 and the rib 182, specifically, sandwiched and held between a side surface 181a of the rib 181 and a side surface 182a of the rib 182. Accordingly, the clamp portion 80b can reliably hold the second harness 70.

At this time, the second harness 70 may be wired so as to abut on the side surface 181a of the rib 181. Accordingly, a force F1 (see FIG. 6) from the side surface 181a of the rib 181 toward the rib 182 acts on the second harness 70. The second harness 70 is pushed toward the rib 182 by the force F1, and is reliably sandwiched and held between the side surface 181a of the rib 181 and the side surface 182a of the rib 182. Accordingly, the clamp portion 80b can more reliably hold the second harness 70.

The rib 182 includes a lock 183 capable of locking the second harness 70. For example, the lock 183 is formed so as to protrude laterally from a distal end 182b of the rib 182, specifically, is formed so as to protrude from the distal end 182b so as to cover a part or the whole of an upper portion of the second harness 70.

For example, when the second harness 70 moves upward from between the rib 181 and the rib 182 due to a wiring operation of the second harness 70, vibration acting on the display device 10 after the wiring, or the like, the second harness 70 is locked (in other words, caught) by the lock 183. Accordingly, for example, it is possible to prevent the second harness 70 from coming off and falling off upward from the clamp portion 80b.

In the above description, the rib 182 of the plurality of ribs 181 and 182 includes the lock 183, but the present invention is not limited thereto, and for example, the rib 181 or both of the plurality of ribs 181 and 182 may include the lock. That is, at least one rib (here, rib 182) of the plurality of ribs 181 and 182 may include the lock 183.

Figure 7:
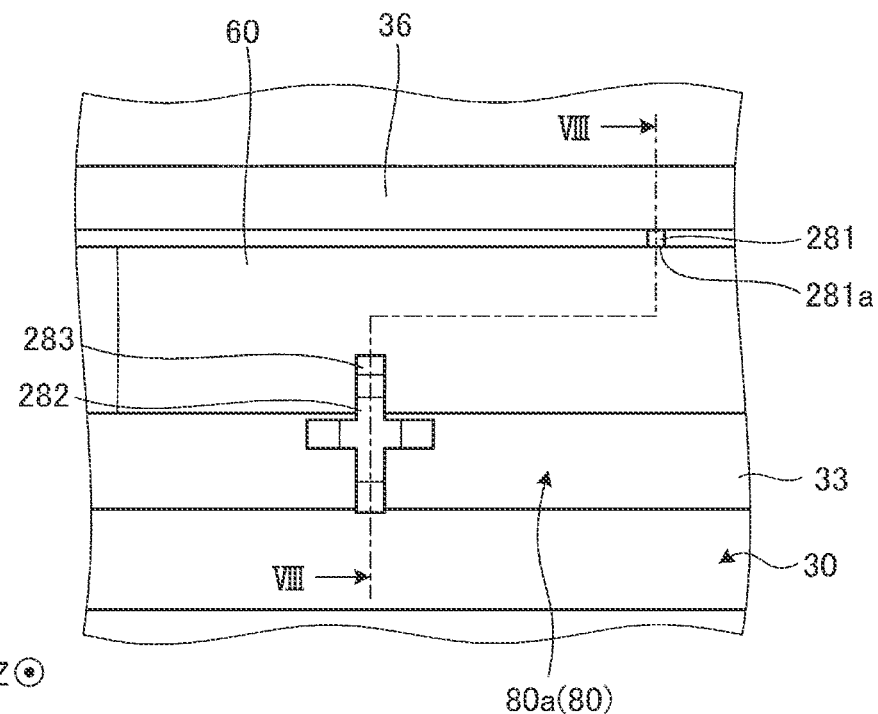
FIG. 7 is an enlarged view of a clamp portion in a second wiring area.
Figure 8:
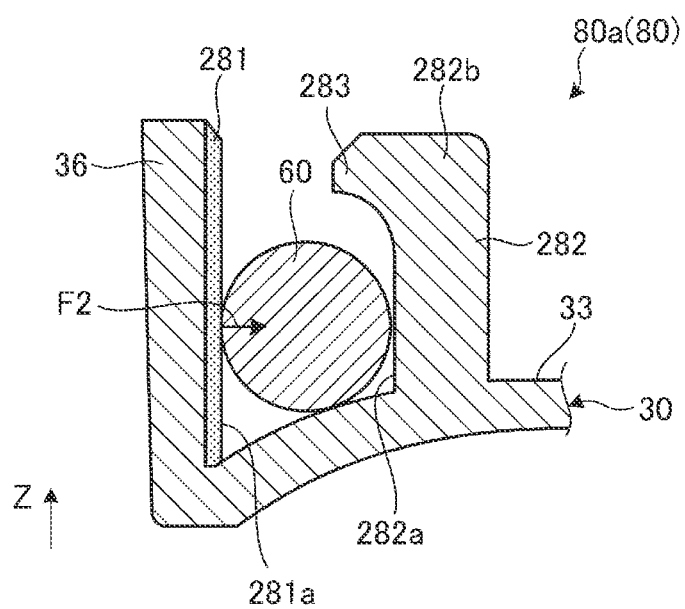
FIG. 8 is a cross-sectional view taken along a line VIII-VIII of FIG. 7.

Next, among the plurality of clamp portions 80a shown in FIG. 4A, the clamp portion 80a formed in the second wiring area 35b (specifically, wiring area 35b1) will be described with reference to FIGS. 7 and 8. FIG. 7 is an enlarged view of the clamp portion 80a of the second wiring area 35b, and specifically, is an enlarged view of a portion D2 surrounded by a two-dot chain line in FIG. 4A. FIG. 8 is a cross-sectional view taken along a line VIII-VIII of FIG. 7.

As shown in FIGS. 7 and 8, the clamp portion 80a includes a plurality of (for example, two) ribs 281 and 282. The ribs 281 and 282 are formed on the wiring area 33 of the main body 30, and more specifically, are formed so as to protrude upward (positive Z-axis direction) from the wiring area 33. Here, the rib 281 is formed so as to extend along a wall portion 36 on the upper end side 32c (see FIG. 4A) of the main body 30. In FIG. 8B, in order to clearly distinguish between the wall portion 36 and the rib 281, the rib 281 is indicated by dots.

The ribs 281 and 282 are formed to be separated from each other. For example, the ribs 281 and 282 are formed to be separated from each other along a wiring direction of the first harness 60. The ribs 281 and 282 are formed so as to be alternated with each other with the first harness 60 interposed therebetween, in other words, are formed so as to be inclined with respect to each other with the first harness 60 interposed therebetween.

The first harness 60 is wired between the rib 281 and the rib 282 configured as described above. That is, the first harness 60 is wired and held so as to be sandwiched between the rib 281 and the rib 282, specifically, sandwiched and held between a side surface 281a of the rib 281 and a side surface 282a of the rib 282. Accordingly, the clamp portion 80a can reliably hold the first harness 60.

At this time, the first harness 60 may be wired so as to abut on the side surface 281a of the rib 281. Accordingly, a force F2 (see FIG. 8) from the side surface 281a of the rib 281 toward the rib 282 acts on the first harness 60. The first harness 60 is pushed toward the rib 282 by the force F2, and is reliably sandwiched and held between the side surface 281a of the rib 281 and the side surface 282a of the rib 282. Accordingly, the clamp portion 80a can more reliably hold the first harness 60.

The rib 282 includes a lock 283 capable of locking the first harness 60. For example, the lock 283 is formed so as to protrude laterally from a distal end 282b of the rib 282, specifically, is formed so as to protrude from the distal end 282b so as to cover a part or the whole of an upper portion of the first harness 60.

For example, when the first harness 60 moves upward from between the rib 281 and the rib 282 due to a wiring operation of the first harness 60, vibration acting on the display device 10 after the wiring, or the like, the first harness 60 is locked (in other words, caught) by the lock 283. Accordingly, for example, it is possible to prevent the first harness 60 from coming off and falling off upward from the clamp portion 80a.

In the above description, the rib 282 of the plurality of ribs 281 and 282 includes the lock 283, but the present invention is not limited thereto, and for example, the rib 281 or both of the plurality of ribs 281 and 282 may include the lock. That is, at least one rib (here, rib 282) of the plurality of ribs 281 and 282 may include the lock 283.

Next, the clamp portion 80 formed in the first wiring area 35*a* will be described. As shown in FIG. 4B, in the display device 10 according to the present embodiment, the clamp portion 80*a* capable of holding the first harness 60 and the clamp portion 80*b* capable of holding the second harness 70 are formed in the wiring area 33 including the first wiring area 35*a*. In the example of FIG. 4B, a plurality of clamp portions 80*a* and 80*b* are formed, but the number and positions of the clamp portions 80*a* and 80*b* are merely examples and are not limited thereto.

Figure 9:
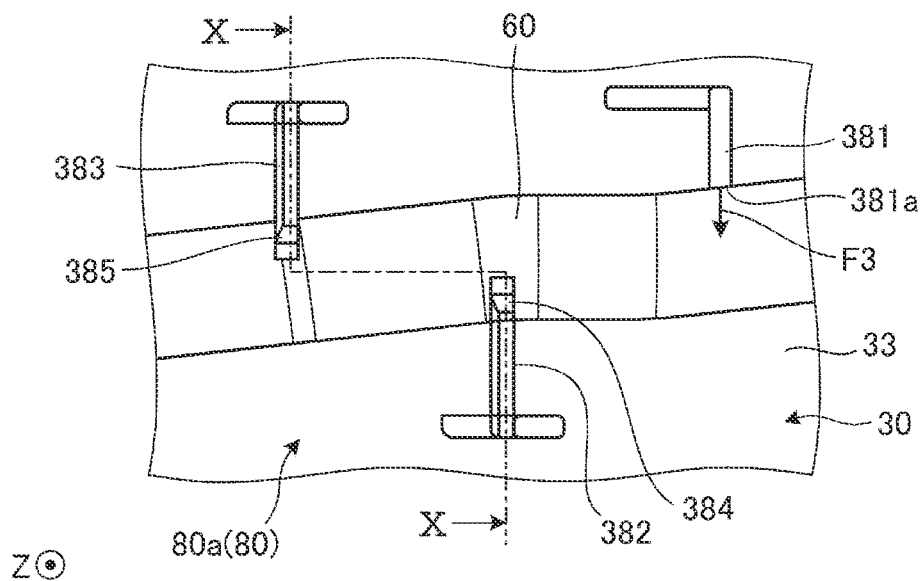
FIG. 9 is an enlarged view of a clamp portion in a first wiring area.
Figure 10:
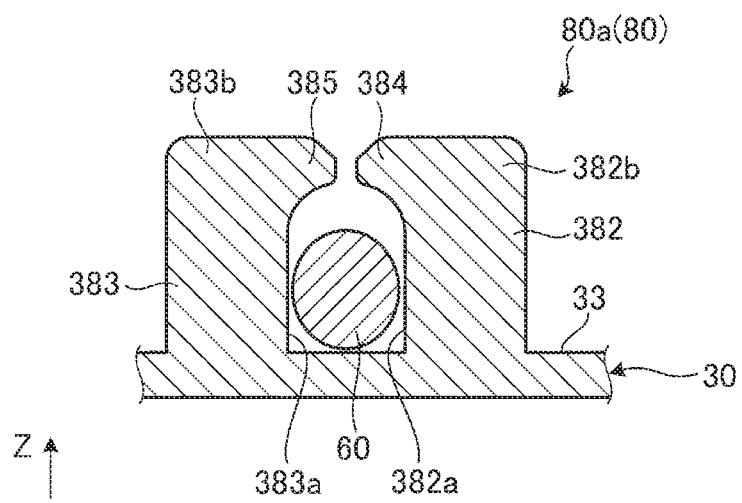
FIG. 10 is a cross-sectional view taken along a line X-X of FIG. 9.

First, among the plurality of clamp portions 80*a*, the clamp portion 80*a* formed in the first wiring area 35*a* (specifically, wiring area 35*a*1) will be described with reference to FIGS. 9 and 10. FIG. 9 is an enlarged view of the clamp portion 80*a* of the first wiring area 35*a*, and specifically, is an enlarged view of a portion D3 surrounded by a two-dot chain line in FIG. 4B. FIG. 10 is a cross-sectional view taken along a line X-X of FIG. 9.

As shown in FIGS. 9 and 10, the clamp portion 80*a* includes a plurality of (for example, three) ribs 381, 382, and 383. The ribs 381, 382, and 383 are formed on the wiring area 33 of the main body 30, and more specifically, are formed so as to protrude upward from the wiring area 33.

The ribs 381, 382, and 383 are formed to be separated from each other. For example, the ribs 381, 382, and 383 are formed so as to be separated from each other along the wiring direction of the first harness 60. The ribs 381, 382, and 383 are formed so as to be alternated with each other with the first harness 60 interposed therebetween, in other words, are formed so as to be inclined with respect to each other with the first harness 60 interposed therebetween. Specifically, the ribs 381 and 383 are formed on one side with respect to the first harness 60, and the rib 382 is formed on the other side with respect to the first harness 60.

The first harness 60 is wired between ribs 381 and 383 and the rib 382 configured as described above. That is, the first harness 60 is wired and held so as to be sandwiched between the ribs 381 and 383 and the rib 382, specifically, sandwiched and held between side surfaces 381*a* and 383*a* of the ribs 381 and 383 and a side surface 382*a* of the rib 382. Accordingly, the clamp portion 80*a* can reliably hold the first harness 60.

At this time, the first harness 60 may be wired so as to abut on the side surface 381*a* (see FIG. 9) of the rib 381. Accordingly, a force F3 (see FIG. 9) from the side surface 381*a* of the rib 381 toward the rib 382 acts on the first harness 60. The first harness 60 is pushed toward the rib 382 by the force F3, and is reliably sandwiched and held between the side surface 381*a* of the rib 381 and the side surface 382*a* of the rib 382. Accordingly, the clamp portion 80*a* can more reliably hold the first harness 60.

The rib 382 includes a lock 384 capable of locking the first harness 60. For example, the lock 384 is formed so as to protrude laterally from a distal end 382*b* of the rib 382, specifically, is formed so as to protrude from the distal end 382*b* so as to cover a part or the whole of an upper portion of the first harness 60. Similarly, the rib 383 includes a lock 385 capable of locking the first harness 60. For example, the lock 385 is formed so as to protrude laterally from a distal end 383*b* of the rib 383, specifically, is formed so as to protrude from the distal end 383*b* so as to cover a part or the whole of an upper portion of the first harness 60.

For example, when the first harness 60 moves upward from between the ribs 381 and 383 and the rib 382 due to a wiring operation of the first harness 60, vibration acting on the display device 10 after the wiring, or the like, the first harness 60 is locked by the locks 384 and 385. Accordingly, for example, it is possible to prevent the first harness 60 from coming off and falling off upward from the clamp portion 80*a*.

In the above description, the ribs 382 and 383 of the plurality of ribs 381, 382, and 383 include the locks 384 and 385, but the present invention is not limited thereto, and for example, the rib 381 or all of the plurality of ribs 381, 382, and 383 may include the lock. That is, at least one rib (here, ribs 382 and 383) of the plurality of ribs 381, 382, and 383 may include the locks 384 and 385.

Figure 11:
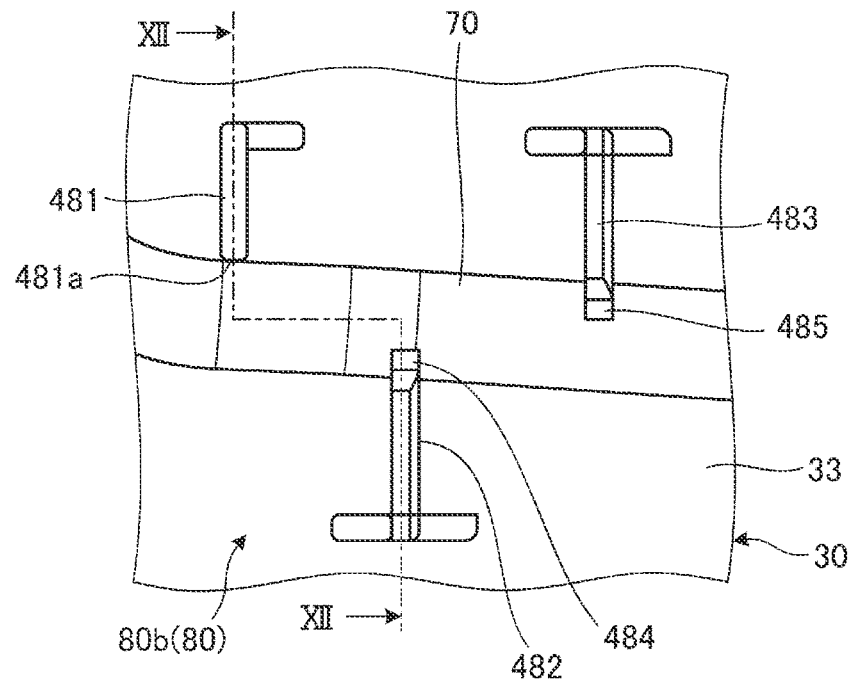
FIG. 11 is an enlarged view of a clamp portion in a first wiring area.
Figure 12:
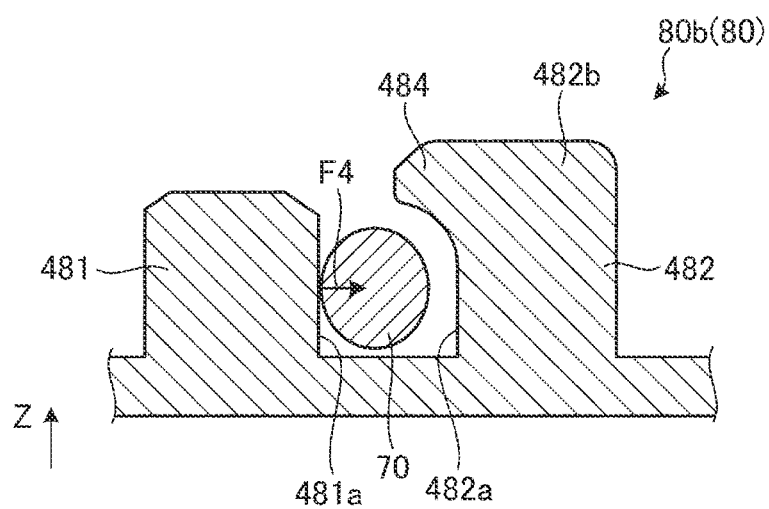
FIG. 12 is a cross-sectional view taken along a line XII-XII of FIG. 11.

Next, among the plurality of clamp portions 80*b* shown in FIG. 4B, the clamp portion 80*b* formed in the first wiring area 35*a* (specifically, wiring area 35*a*2) will be described with reference to FIGS. 11 and 12. FIG. 11 is an enlarged view of the clamp portion 80*b* of the first wiring area 35*a*, and specifically, is an enlarged view of a portion D4 surrounded by a two-dot chain line in FIG. 4B. FIG. 12 is a cross-sectional view taken along a line XII-XII of FIG. 11.

As shown in FIGS. 11 and 12, the clamp portion 80*b* includes a plurality of (for example, three) ribs 481, 482, and 483. The ribs 481, 482, and 483 are formed on the wiring area 33 of the main body 30, and more specifically, are formed so as to protrude upward from the wiring area 33.

The ribs 481, 482, and 483 are formed to be separated from each other. For example, the ribs 481, 482, and 483 are formed so as to be separated from each other along the wiring direction of the second harness 70. The ribs 481, 482, and 483 are formed so as to be alternated with each other with the second harness 70 interposed therebetween, in other words, are formed so as to be inclined with respect to each other with the second harness 70 interposed therebetween. Specifically, the ribs 481 and 483 are formed on one side with respect to the second harness 70, and the rib 482 is formed on the other side with respect to the second harness 70.

The second harness 70 is wired between ribs 481 and 483 and the rib 482 configured as described above. That is, the second harness 70 is wired and held so as to be sandwiched between the ribs 481 and 483 and the rib 482, specifically, sandwiched and held between a side surface 481*a* (a side surface of the rib 483 is not seen) of the ribs 481 and 483 and a side surface 482*a* of the rib 482. Accordingly, the clamp portion 80*b* can reliably hold the second harness 70.

At this time, the second harness 70 may be wired so as to abut on the side surface 481*a* of the rib 481. Accordingly, a force F4 (see FIG. 12) from the side surface 481*a* of the rib 481 toward the rib 482 acts on the second harness 70. The second harness 70 is pushed toward the rib 482 by the force F4, and is reliably sandwiched and held between the side surface 481*a* of the rib 481 and the side surface 482*a* of the rib 482. Accordingly, the clamp portion 80*b* can more reliably hold the second harness 70.

The rib 482 includes a lock 484 capable of locking the second harness 70. For example, the lock 484 is formed so as to protrude laterally from a distal end 482*b* of the rib 482, specifically, is formed so as to protrude from the distal end 482*b* so as to cover a part or the whole of an upper portion of the second harness 70. Similarly, the rib 483 includes a lock 485 capable of locking the second harness 70.

For example, when the second harness 70 moves upward from between the rib 481 and the rib 482 due to a wiring operation of the second harness 70, vibration acting on the display device 10 after the wiring, or the like, the second harness 70 is locked by the locks 484 and 485. Accordingly, for example, it is possible to prevent the second harness 70 from coming off and falling off upward from the clamp portion 80b.

In the above description, the ribs 482 and 483 of the plurality of ribs 481, 482, and 483 include the locks 484 and 485, but the present invention is not limited thereto, and for example, the rib 481 or all of the plurality of ribs 481, 482, and 483 may include the lock. That is, at least one rib (here, ribs 482 and 483) of the plurality of ribs 481, 482, and 483 may include the locks 484 and 485.

As described above, in the present embodiment, the clamp portion 80a for the first harness 60 and the clamp portion 80b for the second harness 70 are formed. Accordingly, for example, even when the wire diameters of the first and second harnesses 60 and 70 are different from each other, the first and second harnesses 60 and 70 can be reliably held by the clamp portion 80a and the clamp portion 80b.

As described above, the electronic device (display device) 10 according to the embodiment includes the panel 40 and the main body 30 to which the panel 40 is reversibly attached. The main body 30 includes the left and right wiring extraction portion 34a and 34b (an example of first and second wiring extraction portions), the connectors 51 and 52 (an example of wiring connection terminals), the first wiring area 35a, the second wiring area 35b, and first and second harnesses 60 and 70 (an example of wires). The left and right wiring extraction portions 34a and 34b are provided opposite to each other on both right and left sides of the main body 30. The connectors 51 and 52 are provided at asymmetrical right and left positions of the main body 30 under the line L connecting the left and right wiring extraction portions 34a and 34b. The first wiring area 35a is between the line L and the connectors 51 and 52, and is provided with a plurality of clamp portions 80 (an example of a clamp). The second wiring area 35b is between the upper end side 32c of the main body 30 above the line L and the first wiring area 35a, and is provided with a plurality of clamp portions 80. The first and second harnesses 60 and 70 extend from one of the left and right wiring extraction portion 34a and 34b to the connectors 51 and 52 so as to be electrically connected to the panel 40.

In addition, the first and second harnesses 60 and 70 are arranged to extend from the first wiring extraction portion (the right wiring extraction portion 34b in the case of the first harness 60, and the left wiring extraction portion 34a in the case of the second harness 70) to the connectors 51 and 52 via the first wiring area 35a, or are arranged to extend from the second wiring extraction portion (the left wiring extraction portion 34a in the case of the first harness 60, and the right wiring extraction portion 34b in the case of the second harness 70) to the connectors 51 and 52 via the first wiring area 35a and the second wiring area 35b. Accordingly, when the attachment direction of the panel 40 with respect to the main body 30 is changed, the first and second harnesses 60 and 70 can be appropriately wired after the components (for example, the first and second harnesses 60 and 70) are shared.

Specifically, the first wire (one of the first harness 60 and the second harness 70; for example, the first harness 60) extends from one of the first and second wiring extraction portions (one of the left wiring extraction portion 34a and the right wiring extraction portion 34b) to one of the wiring connection terminals (connectors 51 and 52) so as to be electrically connected to the panel 40. The second wire (the other one of the first harness 60 and the second harness 70; for example, the second harness 70) extends from one of the first and second wiring extraction portions (that is, the other one of the left and right wiring extraction portions 34a and 34b), which is different from the wiring extraction portion to which the first wire is arranged, to one of the wiring connection terminals (connectors 51 and 52) so as to be electrically connected to the panel 40.

The first wire (one of the first harness 60 and the second harness 70) is arranged to extend from the first wiring extraction portion to one of the wiring connection terminals via the first wiring area 35a, or is arranged to extend from the second wiring extraction portion to the one of the wiring connection terminals via the first and second wiring areas 35a and 35b. The second wire (the other one of the first harness 60 and the second harness 70) is arranged to extend from the second wiring extraction portion to one of the wiring connection terminals via the first wiring area 35a, or is arranged to extend from the first wiring extraction portion to the one of the wiring connection terminals via the first and second wiring areas 35a and 35b. Accordingly, when the attachment direction of the panel 40 with respect to the main body 30 is changed, the first and second harnesses 60 and 70 can be appropriately wired after the components (for example, the first and second harnesses 60 and 70) are shared.

The first and second harnesses 60 and 70 are electrically connected to the connectors 51 and 52 in the main body 30 through the hinge 11. Accordingly, even when the panel 40 is attached to the main body 30 so as to be rotatable about the hinge 11, the first and second harnesses 60 and 70 extending from the panel 40 can be wired.

The first harness 60 is arranged to extend from one of the first and second hinges 11a and 11b to the connector 51 so as to be electrically connected to the panel 40. The second harness 70 is arranged to extend from one of the first and second hinges 11a and 11b, which is different from the hinge 11 to which the first harness 60 is arranged, to the connector 52 so as to be electrically connected to the panel 40.

As an example, as shown in FIG. 4A, the first harness 60 is arranged to extend from the first hinge 11a (one of the first and second hinges 11a and 11b) to the connector 51. The second harness 70 is arranged to extend from the second hinge 11b (the other one of the first and second hinges 11a and 11b) to the connector 52.

As another example, as shown in FIG. 4B, the first harness 60 is arranged to extend from the second hinge 11b (one of the first and second hinges 11a and 11b) to the connector 51. The second harness 70 is arranged to extend from the first hinge 11a (the other one of the first and second hinges 11a and 11b) to the connector 52.

Accordingly, even when the panel 40 is attached to the main body 30 so as to be rotatable about the first and second hinges 11a and 11b, the first and second harnesses 60 and 70 extending from the panel 40 can be wired.

Additional effects and modifications can be easily derived by a person skilled in the art. Therefore, broader aspects of the present invention are not limited to the specific details and the representative embodiment shown and described above. Therefore, various modifications can be made without departing from the spirit or scope of the general inventive concept as defined by the appended claims and equivalents of the claims.

What is claimed is:

1. An electronic device comprising:
a panel; and
a main body to which the panel is reversibly attached, wherein
the main body includes:
first and second wiring extraction portions that are provided opposite to each other on both right and left sides of the main body;
wiring connection terminals that are provided at asymmetrical right and left positions of the main body under a virtual line connecting the first and second wiring extraction portions;
a first wiring area that is between the virtual line and the wiring connection terminals and is provided with a plurality of clamps;
a second wiring area that is between an upper end side of the main body above the virtual line and the first wiring area and is provided with a plurality of clamps; and
a wire that extends from one of the first and second wiring extraction portions to one of the wiring connection terminals so as to be electrically connected to the panel, and
the wire is arranged to extend from the first wiring extraction portion to the one of the wiring connection terminals via the first wiring area, or is arranged to extend from the second wiring extraction portion to the one of the wiring connection terminals via the first and second wiring areas.

2. The electronic device according to claim 1, wherein
the main body includes hinges that are provided opposite to each other on both right and left sides of the main body and that attach the panel to the main body, and
the wire is electrically connected to the one of the wiring connection terminals in the main body through one of the hinges.

3. The electronic device according to claim 2, wherein the main body includes:
first and second hinges that are provided opposite to each other on both right and left sides of the main body and attach the panel to the main body;
a first wire that extends from one of the first and second hinges to one of the wiring connection terminals so as to be electrically connected to the panel; and
a second wire arranged to extend from other one of the first and second hinges to other one of the wiring connection terminals so as to be electrically connected to the panel, the other one of the first and second hinges being different from the one of the first and second hinges to which the first wire is arranged.

4. The electronic device according to claim 1, wherein
the plurality of clamps include a plurality of ribs formed in the first wiring area and the second wiring area of the main body, and
the plurality of ribs are formed to be separated from each other, and are formed so as to sandwich and hold the wire.

5. The electronic device according to claim 2, wherein
the plurality of clamps include a plurality of ribs formed in the first wiring area and the second wiring area of the main body, and
the plurality of ribs are formed to be separated from each other, and are formed so as to sandwich and hold the wire.

6. The electronic device according to claim 3, wherein
the plurality of clamps include a plurality of ribs formed in the first wiring area and the second wiring area of the main body, and
the plurality of ribs are formed to be separated from each other, and are formed so as to sandwich and hold the wire.

7. The electronic device according to claim 4, wherein
at least one of the plurality of ribs comprises a lock capable of locking the wire.

8. The electronic device according to claim 5, wherein
at least one of the plurality of ribs comprises a lock capable of locking the wire.

9. The electronic device according to claim 6, wherein
at least one of the plurality of ribs comprises a lock capable of locking the wire.

10. An electronic device comprising:
a panel; and
a main body to which the panel is reversibly attached, wherein
the main body includes:
first and second wiring extraction portions that are provided opposite to each other on both right and left sides of the main body;
wiring connection terminals that are provided at asymmetrical right and left positions of the main body under a virtual line connecting the first and second wiring extraction portions;
a first wiring area that is between the virtual line and the wiring connection terminals and is provided with a plurality of clamps;
a second wiring area that is between an upper end side of the main body above the virtual line and the first wiring area and is provided with a plurality of clamps;
a first wire that extends from one of the first and second wiring extraction portions to one of the wiring connection terminals so as to be electrically connected to the panel; and
a second wire that extends from other one of the first and second wiring extraction portions to other one of the wiring connection terminals so as to be electrically connected to the panel, the other one of the first and second wiring extraction portions being different from the one of the first and second wiring extraction portions to which the first wire is arranged,
the first wire is arranged to extend from the first wiring extraction portion to the one of the wiring connection terminals via the first wiring area, or is arranged to extend from the second wiring extraction portion to the one of the wiring connection terminals via the first and second wiring areas, and
the second wire is arranged to extend from the second wiring extraction portion to the other one of the wiring connection terminals via the first wiring area, or is arranged to extend from the first wiring extraction portion to the other one of the wiring connection terminals via the first and second wiring areas.

11. The electronic device according to claim 10, wherein
the first wire and the second wire are arranged so as to intersect with each other or are arranged without intersecting with each other.

12. A wiring method of an electronic device including a main body to which a panel is reversibly attached and a wire extending from the panel to the main body, the method comprising:
arranging the wire in a wiring path of the main body, wherein the main body includes:
first and second wiring extraction portions that are provided opposite to each other on both right and left sides of the main body;
wiring connection terminals that are provided at asymmetrical right and left positions of the main body under a virtual line connecting the first and second wiring extraction portions;
a first wiring area that is between the virtual line and the wiring connection terminals and is provided with a plurality of clamps;
a second wiring area that is between an upper end side of the main body above the virtual line and the first wiring area and is provided with a plurality of clamps; and
a wire that extends from one of the first and second wiring extraction portions to one of the wiring connection terminals so as to be electrically connected to the panel, and
the wire extending from the panel is arranged to extend from the first wiring extraction portion to the one of the wiring connection terminals via the first wiring area, or is arranged to extend from the second wiring extraction portion to the one of the wiring connection terminals via the first and second wiring areas.

* * * * *